US009178302B2

(12) United States Patent
Suemitsu et al.

(10) Patent No.: US 9,178,302 B2
(45) Date of Patent: Nov. 3, 2015

(54) WIRE COVER, WIRING METHOD OF WIRES AND ELECTRICAL CONNECTOR

(75) Inventors: Yoshifumi Suemitsu, Chiba (JP); Ryuichi Komiyama, Tokyo (JP); Kazushige Sakamaki, Tokyo (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 533 days.

(21) Appl. No.: 13/190,720

(22) Filed: Jul. 26, 2011

(65) Prior Publication Data

US 2012/0028486 A1 Feb. 2, 2012

(30) Foreign Application Priority Data

Jul. 28, 2010 (JP) ................................ 2010-169708

(51) Int. Cl.

*H01R 13/62* (2006.01)
*H05K 5/00* (2006.01)
*H01R 13/56* (2006.01)
*H01R 13/58* (2006.01)

(52) U.S. Cl.

CPC ............ *H01R 13/56* (2013.01); *H01R 13/5812* (2013.01)

(58) Field of Classification Search

CPC .... H01R 13/5812; H01R 13/56; H01R 13/46; H01R 13/2416
USPC ........ 174/86, 70 R, 71 R, 72 A, 50.52, 50.53, 174/50.55; 439/157, 347
See application file for complete search history.

(56) References Cited

U.S. PATENT DOCUMENTS

| | | | | |
|---|---|---|---|---|
| 5,074,808 | A | 12/1991 | Beamenderfer et al. | |
| 5,244,415 | A | 9/1993 | Marsilio et al. | |
| 5,315,062 | A * | 5/1994 | Hoshino | 439/446 |
| 5,444,182 | A * | 8/1995 | Hoshino | 439/368 |
| 6,225,557 | B1 * | 5/2001 | Fonteneau et al. | 174/50 |
| 6,762,363 | B2 | 7/2004 | Yamashita et al. | |

(Continued)

FOREIGN PATENT DOCUMENTS

| | | | |
|---|---|---|---|
| EP | 0631351 | A2 | 12/1994 |
| EP | 0975060 | A1 | 1/2000 |

(Continued)

OTHER PUBLICATIONS

Search Report issued by UK Intellectual Property Office dated Nov. 24, 2011 for Application No. GB1112813.9, 3 pages.

(Continued)

*Primary Examiner* — Hoa C Nguyen
*Assistant Examiner* — Amol Patel
(74) *Attorney, Agent, or Firm* — Barley Snyder

(57) ABSTRACT

The invention provides a wire cover, a wiring method and an electrical connector that can ensure routing of wires even in a limited space. The connector includes a housing, a lever, and a wire cover. The lever is mounted to the housing, and the wire cover is mounted to a side of a back surface of the housing. The wire cover includes a cover body, a wire routing passageway, and a hood portion. The cover body includes a plurality of wire receiving passageways positioned in one direction, while the wire routing passageway is directed into an inside of the cover body. The hood portion protrudes from a circumference of the wire routing passageway and provides a leading direction out of the wire routing passageway. The hood portion extends in a direction other than a direction of extension from a front surface and the back surface of the cover body.

11 Claims, 6 Drawing Sheets

(56) References Cited

U.S. PATENT DOCUMENTS

| | | | | |
|---|---|---|---|---|
| 7,201,609 | B2 * | 4/2007 | Ishikawa | 439/587 |
| 7,507,108 | B2 | 3/2009 | Tsuji | |
| 2007/0197071 | A1 * | 8/2007 | Patterson | 439/157 |
| 2011/0253035 | A1 | 10/2011 | Amaya et al. | |

FOREIGN PATENT DOCUMENTS

| | | | |
|---|---|---|---|
| EP | 2001089 | A2 | 12/2008 |
| GB | 2461372 | A | 1/2010 |
| JP | 2005310436 | A | 11/2005 |
| JP | 2010092888 | A | 4/2010 |

OTHER PUBLICATIONS

French Search Report, dated May 23, 2012, 6 pages.
JP Patent Publication 2010-92888A, (Priority #JP20100092888) published Apr. 22, 2010, 16 pages.
Japanese Office Action, dated Oct. 1, 2014, 3 pages.
Japanese Office Action, dated Feb. 19, 2014, 3 pages.

* cited by examiner

WIRE COVER, WIRING METHOD OF WIRES AND ELECTRICAL CONNECTOR

CROSS-REFERENCE TO RELATED APPLICATIONS

This application claims the benefit of the filing date under 35 U.S.C. §119 (a)-(d) of Japanese Patent Application No. 2010-169708, filed Jul. 28, 2010.

FIELD OF INVENTION

The invention relates to a wire cover that covers a plurality of wires, a wiring method, and an electrical connector.

BACKGROUND

In recent years, electrical connectors used in the field of automobiles have an increasing number of terminals. In an electrical connector having multiple terminals, multiple wires according to the number of terminals are positioned into a housing of the electrical connector.

The multiple wires are positioned into the housing through a wire receiving passageway formed in the housing, and a terminal positioned at an end of each wire is secured to a terminal receiving passageway formed in the housing.

There is also a connector such that multiple wires are placed along a hood portion formed in a housing, and the hood portion and the multiple wires are secured by a securing member such as a securing band or a cable tie (for example, see Japanese Patent Laid-Open No. 2010-92888). In such a structure, the multiple wires can be bound easily and neatly by securing the multiple wires with the securing band or the like.

However, a control unit for an automobile is installed in a limited space in a vehicle. As a result, it is difficult for to ensure space for routing a cable with tied multiple wires in an electrical connector or the like that connects to a control unit for an automobile. Furthermore, if the cable has a small curvature and routed in a narrow space, a load is applied to the cable, which may cause problems in power and durability of wire coating.

SUMMARY

The invention is achieved in view of such technical problems, and has an object, among others, to provide a wire cover, a wiring method and an electrical connector that can ensure routing of wires even in a limited space.

The connector includes a housing, a lever, and a wire cover. The lever is mounted to the housing, and the wire cover is mounted to a side of a back surface of the housing. The wire cover includes a cover body, a wire routing passageway, and a hood portion. The cover body includes a plurality of wire receiving passageways positioned in one direction, while the wire routing passageway is directed into an inside of the cover body. The hood portion protrudes from a circumference of the wire routing passageway and provides a leading direction out of the wire routing passageway. The hood portion extends in a direction other than a direction of extension from a front surface and the back surface of the cover body.

BRIEF DESCRIPTION OF THE DRAWINGS

The invention is described in more detail in the following with reference to the embodiments shown in the drawings. Similar or corresponding details in the Figures are provided with the same reference numerals. The invention will be described in detail with reference to the following figures of which.

DETAILED DESCRIPTION OF THE EMBODIMENT(S)

Now, the present invention will be described in detail based on an embodiment shown in the accompanying drawings.

Figure 1:
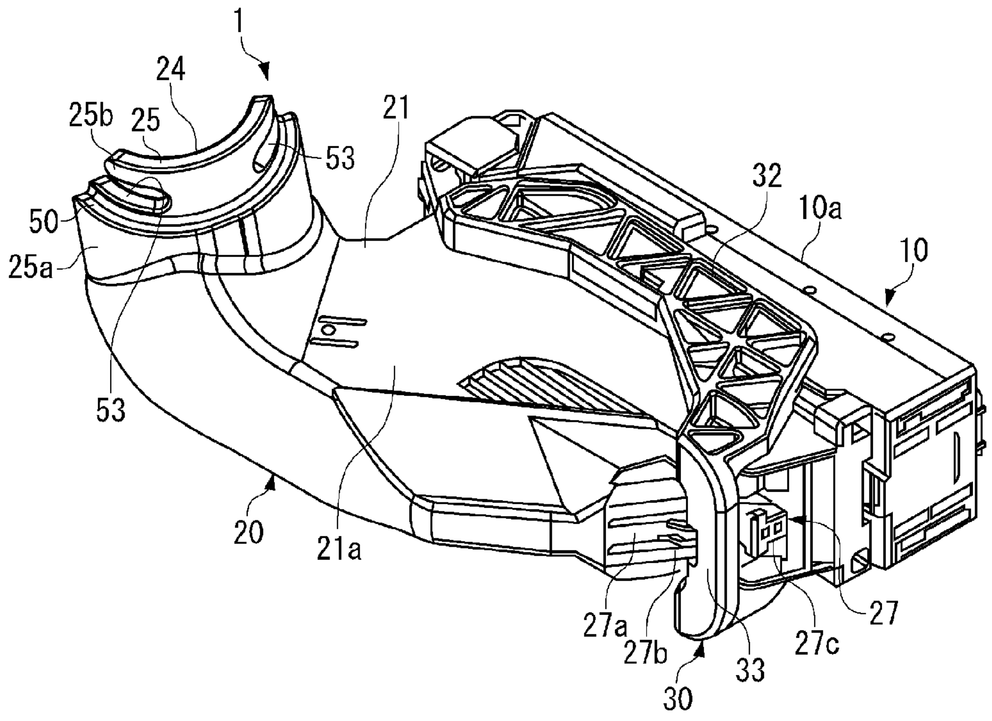
FIG. 1 is a perspective view of a lever connector according to the invention.
Figure 2:
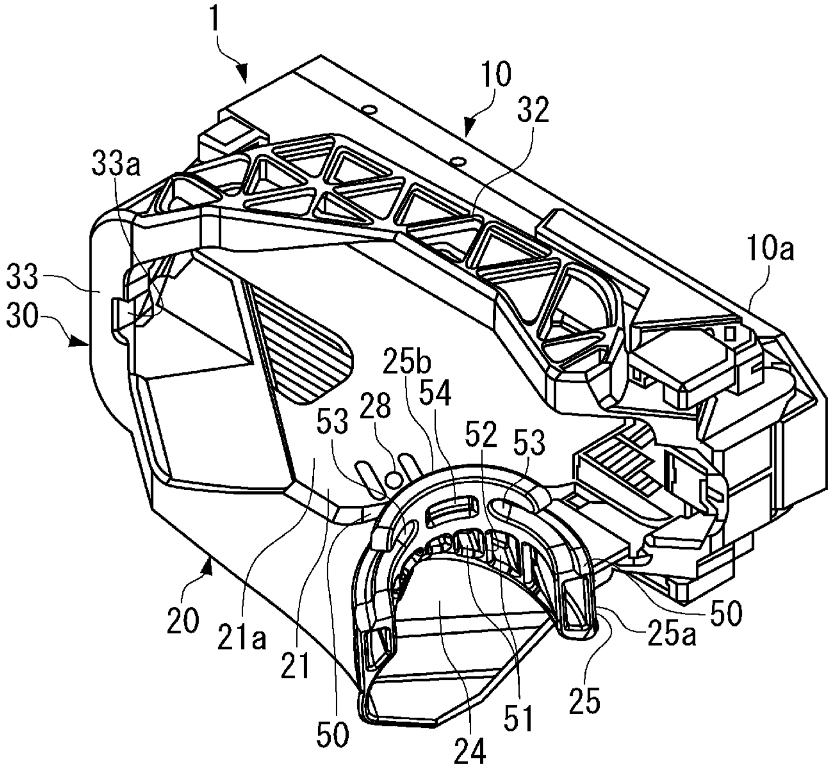
FIG. 2 is a perspective view of the lever connector shown from an angle different than that in FIG. 1.
Figure 3:
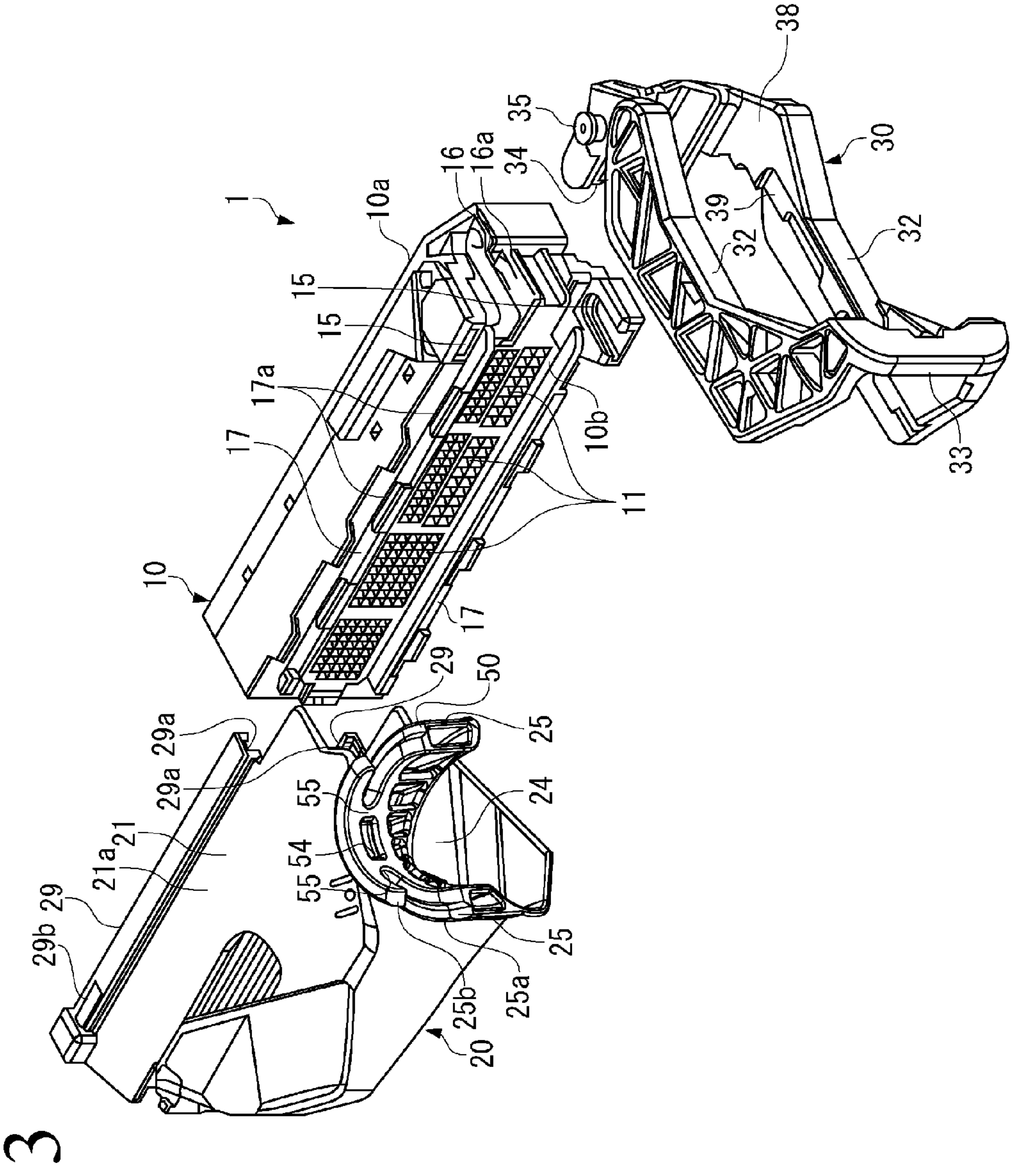
FIG. 3 is an exploded perspective view of the lever connector according to the invention.

As shown in FIGS. 1 to 3, a lever connector 1 includes a housing 10 that receives a plurality of terminals (not shown), a wire cover 20 mounted to a side of a back surface 10*b* (see FIG. 3) of the housing 10, and a lever 30 mounted to the housing 10.

In the embodiment shown, the housing 10 extends in one direction along a front surface 10*a* facing a connection object of the lever connector 1. In the housing 10, a plurality of terminal receiving passageways 11 are formed in one direction and in a plurality of columns passing through the housing 10 in a direction connecting the front surface 10*a* and the back surface 10*b*.

At one end of the housing 10, a pair of lever connectors 16 are provided that connect with a shaft portion 34 of a lever 30, which is described later. Along a rear of each lever connector 16 of the housing 10, a latch arm 16*a* is positioned for locking the shaft portion 34 of the lever 30 fitted to each lever connector 16. Securing pieces 17 for securing the wire cover 20 are positioned along vertically opposite ends of the back surface of the housing 10. Each securing piece 17 is provided to protrude from the back surface 10*b*. A plurality of securing protrusions 17*a* protruding outward are positioned near each securing piece 17.

A lever connector 15 is positioned at one end of the housing 10, to which a slider moving shaft 35 described later of the lever 30 is fitted.

The lever 30 includes a pair of side plates 32 and a connecting portion 33 connecting other ends of the side plates 32. The lever has a U-shape in the embodiment shown.

The slider moving shaft 35 that is fitted to the lever connector 15 is formed to protrude outward and positioned on an outer surface at one end of each of the side plates 32. The shaft portion 34 that is fitted the lever connector 16 of the housing 10 is formed to protrude inward and positioned on an inner surface at one end of each side plate 32. The shaft portion 34 is fitted to the lever connector 16, and thus the lever 30 pivots around the shaft portion 34 with respect to the housing 10. When the lever 30 is pivots, the slider moving shaft 35 moves along a guide groove formed in a counterpart connector as a connection object to assist fitting between the lever connector 1 and the corresponding connector.

Further, a flat portion 38 is positioned along the inner surface at one end of the side plate 32, which is brought into contact with the wire cover 20 when the lever 30 is removed from the housing 10. Also a notch portion 39 extending in a lateral direction is positioned along the inner surface of the side plate 32.

A recess 33*a* is positioned along the connecting portion 33, in which a locking piece 27*b* of a lock 27 of the wire cover 20 is locked, which will be described in more detail below.

The wire cover 20 has a cover body 21 that covers wires (not shown) connected to the terminals that have are received in the housing 10. The cover body 21 is closed except for a side facing the housing 10 and a wire routing passageway 24 described later.

As shown in FIG. 1, a lock 27 is positioned on a back surface of the cover body 21. The lock 27 secures the lever 30 when the lever 30 is tilted. The lock 27 includes a cantilevered leaf spring 27*a*, the locking piece 27*b*and an unlocking protrusion 27*c* that is positioned on an outer surface of the leaf spring 27*a*. The leaf spring 27*a* extends toward a connecting portion 33 of the tilted lever 30 in the embodiment shown. The locking piece 27*b* is locks in the recess 33*a* in the connecting portion 33 of the tilted lever 30. When the unlocking protrusion 27*c* is pressed away from the connecting portion 33, the leaf spring 27*a* is elastically deformed that disengages the locking piece 27*b* from the recess 33*a*.

A locking protrusion 28 for locking the raised lever 30 is positioned on the cover body 21. Each locking protrusion 28 locks with a notch portion 39 formed along each side plate 32 of the raised lever 30.

Securing portions 29 for securing the wire cover 20 to the housing 10 are positioned on a side facing the housing 10 of the cover body 21. Each securing portion 29 has a securing groove portion 29*a* into which the securing protrusion 17*a* of the housing 10 is inserted. A latch arm 29*b* is positioned at the other end of each securing portion 29. A protrusion (not shown) that locks to a side surface of the securing protrusion 17*a* of the housing 10 is positioned on each latch arm 29*b*.

Figure 4A:
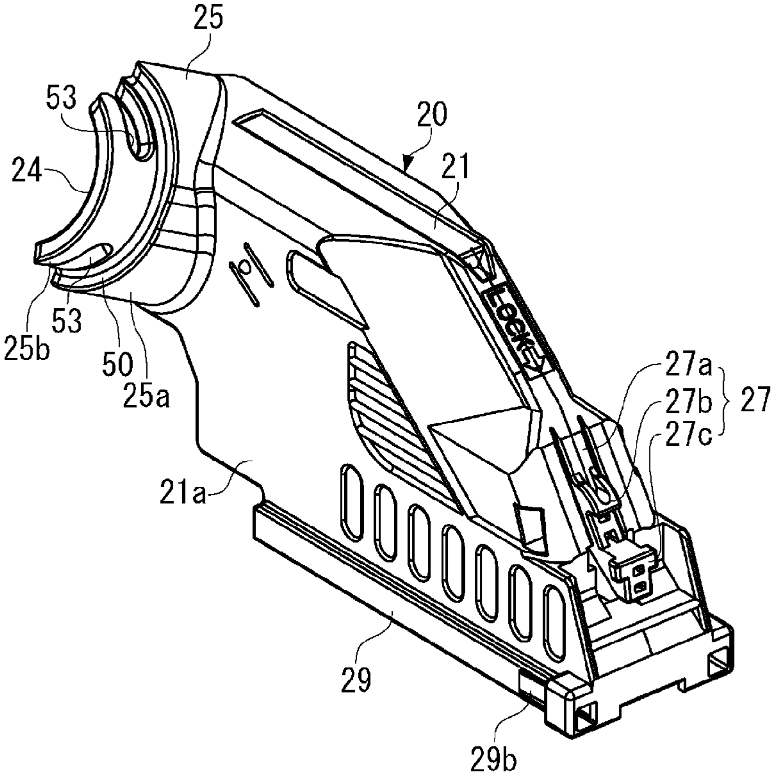
FIG. 4A is a perspective view of a wire cover of the lever connector according to the invention.
Figure 4B:
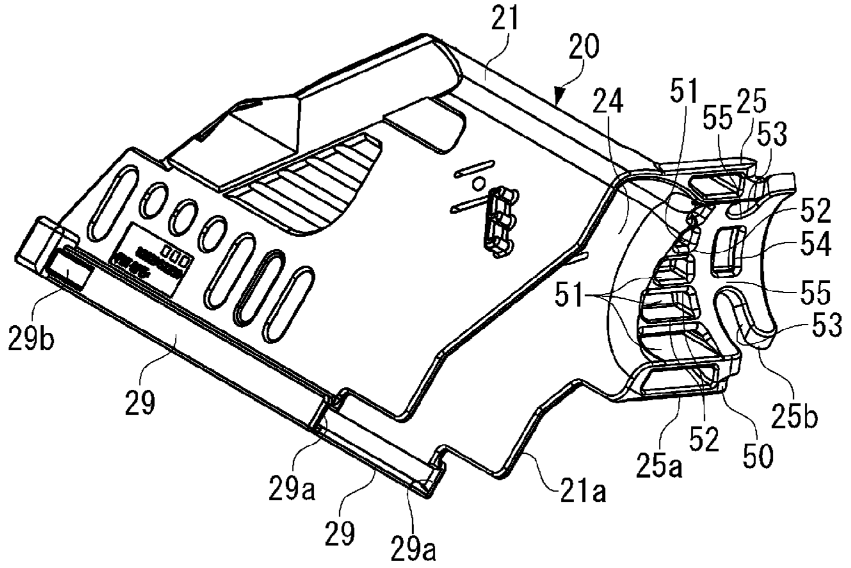
FIG. 4B is a perspective view of the wire cover of FIG. 4A, shown from an angle different than that in FIG. 4A.
Figure 5:
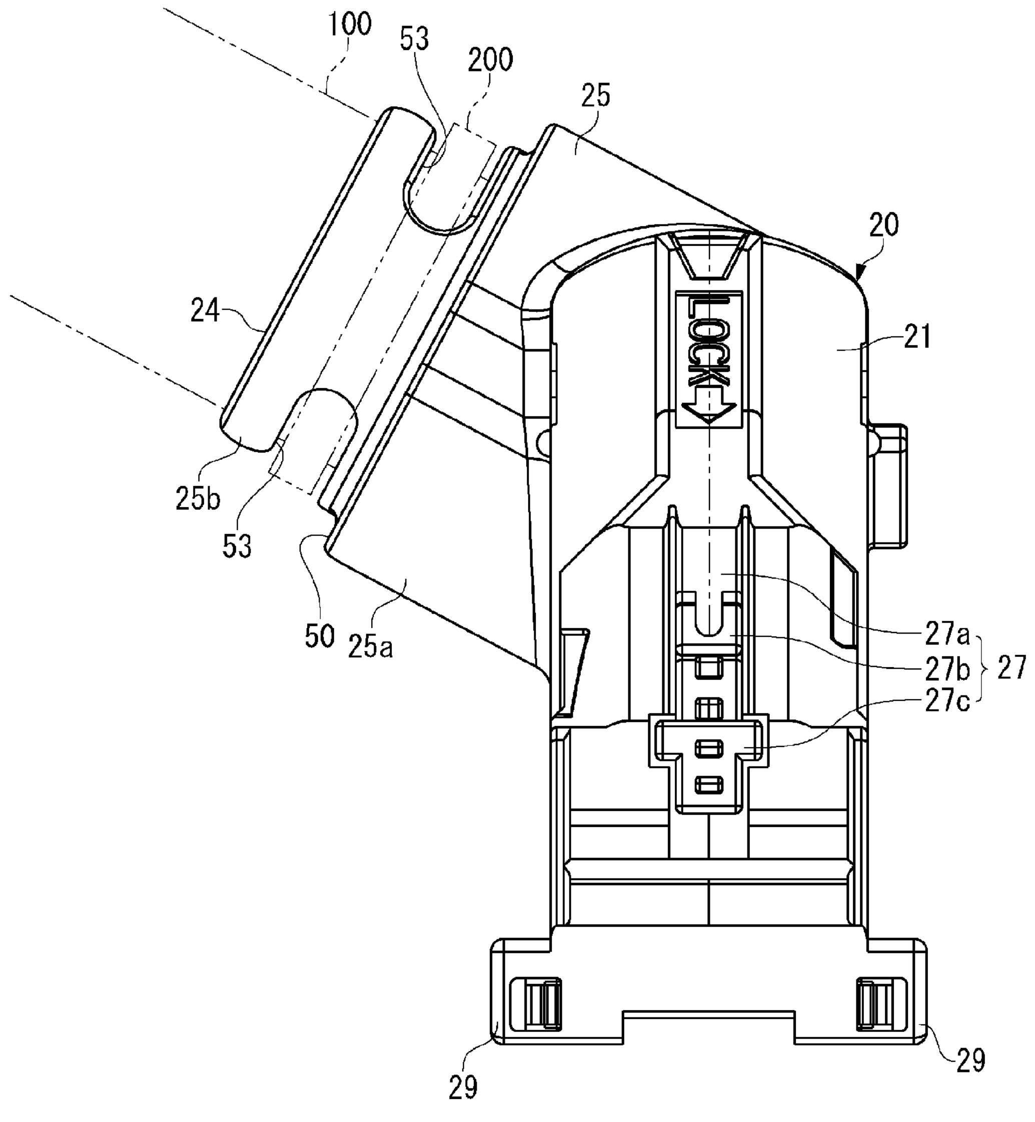
FIG. 5 is a side view of the wire cover of the lever connector according to the invention.

As shown in FIGS. 4A, 4B and 5, a wire routing passageway 24 is positioned at one end of the cover body 21, through which the wires connected to the terminals, received in the housing 10, are led out in a secured state. A hood portion 25 is positioned around the wire routing passageway 24. The hood portion 25 connects along a front surface side and a back surface side of the wire cover 20, and protrudes in an inclined direction with respect to a surface including a longitudinal direction of the housing 10.

The hood portion 25 diagonally controls a draw-out direction of the wires from the wire routing passageway 24. The inclination angle and direction of the hood portion 25 are not limited to those shown, but may be other angles and directions.

The hood portion 25 includes an arcuate section. The hood portion 25 in the embodiment shown has different thicknesses between a base 25*a* on a side of the cover body 21 and a tip 25*b* on a side away from the cover body 21. The base 25*a* is thicker than the tip 25*b*. Inner peripheral surfaces of the base 25*a* and the tip 25*b* are smoothly continuous. Meanwhile, a step 50 is formed between outer peripheral surfaces of the base 25*a* and the tip 25*b* because of the different thicknesses.

A plurality of recesses 51 are positioned in an inner peripheral surface of the base 25*a*. The recesses 51 are arranged continuously in a curving direction (circumferential direction) of the hood portion 25, and thus a rib 52 continuous in an extending direction of the hood portion 25 is positioned between the recesses 51 and 51 adjacent to each other.

In a tip 25*b* of the hood portion 25, notches 53 and 53 extending in a circumferential direction are positioned at opposite ends. A recess 54 is formed between the notches 53 and 53, in an inner peripheral surface of the tip 25*b* of the hood portion 25. Between the recess 54 and each of the notches 53 and 53 on opposite sides thereof, a rib 55 continuous in the extending direction of the hood portion 25 is positioned.

In the lever connector 1, a cable 100 with a plurality of wires being tied is inserted through and led out from the wire routing passageway 24. The cable 100 is separated into the wires within an inner space of the wire cover 20, and a terminal provided at a tip of each wire is inserted and fitted into the terminal receiving passageway 11 of the housing 10.

The cable 100 is led out from the wire routing passageway 24 to an exterior of the lever connector 1. The cable 100 is positioned along the inner peripheral surface of the hood portion 25 and thus controlled in the lead-out direction. Thus, the cable 100 is diagonally led out according to the inclination direction of the hood portion 25 in the embodiment shown.

The cable 100 is positioned along the hood portion 25, and a strap-like securing member 200, such as a securing band or a cable tie, is wound there around to tie and secure the hood portion 25 and the cable 100.

In order to fit the lever connector 1 to a counterpart connector to each other, the lever 30 is first raised. The raised lever 30 is locked by the locking protrusion 28 on the cover body 21 of the wire cover 20 being locked to a side surface of the notch portion 39 in each side plate 32 of the lever 30. In this state, the lever connector 1 and the counterpart connector are temporarily fitted to each other.

Next, the locking protrusion 28 on the cover body 21 of the wire cover 20 is unlocked from the lever 30, and the raised lever 30 is pivoted in a tilting direction. When the lever 30 is tilted, the slider moving shaft 35 moves along the guide groove positioned in the counterpart connector to assist fitting between the lever connector 1 and the counterpart connector, and the plurality of terminals received in the housing 10 of the lever connector 1 are fitted to the terminals received in the counterpart connector.

When the lever 30 is pivoted and tilted, the lever connector 1 fits with the counterpart connector and connection is completed. The locking piece 27*b* locks into in the recess 33*a* of the connecting portion 33, preventing the tilted lever 30 from pivoting.

In the lever connector 1 as described above, the hood portion 25 of the wire cover 20 is formed to protrude diagonally. Thus, the cable 100 is led out diagonally from the exit in the wire cover 20 according to the inclination direction of the hood portion 25, and the cable 100 can be optimally routed according to a space therearound to increase flexibility of routing of the cable 100 within a limited space. This design can prevent the cable 100 from being bent which may apply a load to the cable 100. In addition, this design provides high durability of the cable 100.

Further, when a lever connector 1 with a different depicted direction (angle) of a cable 100 is configured, only a wire cover 20 may be changed and other components such as a housing 10 need not be changed. This allows the cable 100 to be drawn out at various angles at low cost.

At this time, the hood portion 25 has different thicknesses between the base 25*a* on the side of the cover body 21 and the tip 25*b* on the side away from the cover body 21, and the base 25*a* is thicker than the tip 25*b*. Thus, even if a force is applied from the cable 100 to the hood portion 25 when the operator routes the cable 100 during assembly, the base 25*a* particularly has a large thickness, thereby preventing the hood portion 25 from being broken or damaged.

Further, in the inner peripheral surface of the base 25*a*, the plurality of recesses 51 are formed, thereby reducing use of a material required for forming the wire cover 20, and also reducing weight of the wire cover 20. Further, the recesses 51 are continuously arranged around the circumference of the hood portion 25, and thus the rib 52 is formed between the recesses 51 and 51 adjacent to each other. Thus, when the cable 100 is routed and a force is applied to the hood portion 25, the force is transferred from the tip 25*b* side to the base 25*a* side through the rib 52. This allows effective treatment and dissipation of the force applied to the hood portion 25.

In the embodiment shown, the configuration of the lever connector 1 has been described, and configurations other than the hood portion 25 that is the gist of the claimed invention may be changed.

The protruding direction of the hood portion 25 from the cover body 21 may be directions other than that shown.

Figure 6A:
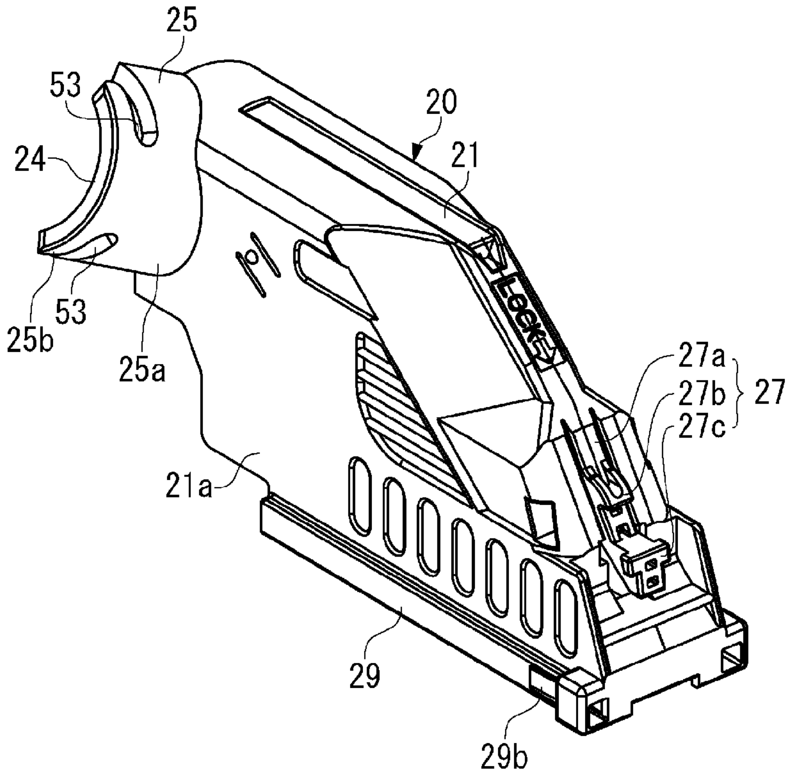
FIG. 6A is a perspective view of another wire cover according to the invention.
Figure 6B:
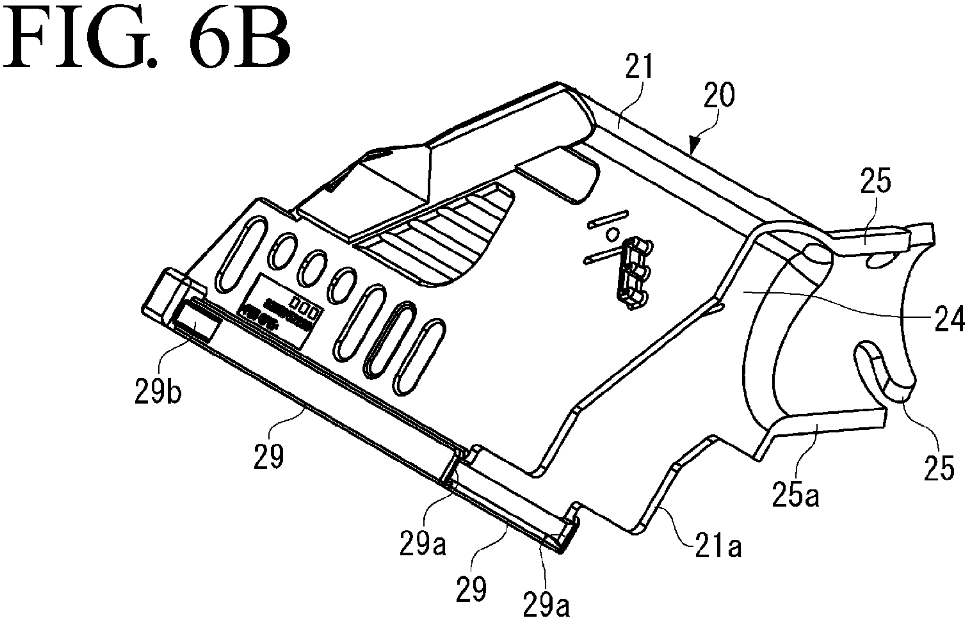
FIG. 6B is a perspective view of the wire cover in FIG. 6A, shown from an angle different than that in FIG. 6A.

Further, in the embodiment shown, the hood portion 25 is formed to have different thicknesses between the base 25*a* on the side of the cover body 21 and the tip 25*b* on the side away from the cover body 21. However, as shown in FIGS. 6A and 6B, the hood portion 25 may be formed so that the base 25*a* on the side of the cover body 21 and the tip 25*b* on the side away from the cover body 21 have the same thickness.

In this embodiment, the lever connector 1 that can be easily mounted and removed by pivoting the lever 30 is illustrated as an example. However, not limited to the lever connector, the invention may be similarly applied to a general connector or the like.

Further, the configurations described in the embodiment may be chosen or changed to other configurations without departing from the gist of the present invention.

What is claimed is:

1. A wire cover, comprising:

a cover body having a wire receiving passageway positioned in one direction and a plurality of recesses positioned along an inner peripheral surface of a base on a side of the cover body;

a wire routing passageway directed into an inside of the cover body; and a hood portion protruding from a circumference of the wire routing passageway and controlling a leading direction out of the wire routing passageway;

wherein the hood portion protrudes in a direction other than a direction of extension from a surface of the cover body;

wherein the hood portion has different thicknesses between the base and a tip on a side away from the cover body and the base is thicker than the tip;

wherein inner peripheral surfaces of the base and the tip are smoothly continuous;

wherein a step is positioned between outer peripheral surfaces of the base and the tip; and wherein the plurality of recesses are arranged continuously in a circumferential direction of the hood portion.

2. The wire cover according to claim 1, wherein the hood portion protrudes in a direction substantially perpendicular to a direction extending perpendicular to the surface of the cover body.

3. The wire cover according to claim 1, wherein the hood portion protrudes in an inclined direction with respect to a surface including a longitudinal direction of the wire cover.

4. The wire cover according to claim 1, further comprising a rib positioned between the plurality of recesses adjacent to each and continuous in an extending direction of the hood portion.

5. A lever connector, comprising:

a housing;

a lever mounted to the housing; and a wire cover mounted to a side of a back surface of the housing, comprising:

a cover body having a wire receiving passageway positioned in one direction and a plurality of recesses positioned along an inner peripheral surface of a base on a side of the cover body;

a wire routing passageway directed into an inside of the cover body; and a hood portion protruding from a circumference of the wire routing passageway and controlling a leading direction out of the wire routing passageway;

wherein the hood portion protrudes in a direction other than a direction of extension from a surface of the cover body;

wherein the hood portion has different thicknesses between the base and a tip on a side away from the cover body and the base is thicker than the tip;

wherein inner peripheral surfaces of the base and the tip are smoothly continuous; and wherein a step is positioned between outer peripheral surfaces of the base and the tom.

6. The lever connector according to claim 5, wherein the lever is a U-shaped lever having a pair of side plates and a connecting portion that connects the pair of side plates to each other.

7. The lever connector according to claim 6, wherein the lever is mounted pivotably with respect to the housing where the lever crosses the back surface of the wire cover and the wire cover is held in a thickness direction between the pair of side plates.

8. The lever connector according to claim 5, wherein the hood portion protrudes in a direction substantially perpendicular to a direction extending perpendicular to the surface of the cover body.

9. The lever connector according to claim 8, wherein the hood portion protrudes in an inclined direction with respect to a surface including a longitudinal direction of the housing.

10. The lever connector according to claim 5, wherein the plurality of recesses are arranged continuously in a circumferential direction of the hood portion.

11. The lever connector according to claim 10, further comprising a rib positioned between the plurality of recesses adjacent to each and continuous in an extending direction of the hood portion.

* * * * *

UNITED STATES PATENT AND TRADEMARK OFFICE

CERTIFICATE OF CORRECTION

PATENT NO. : 9,178,302 B2
APPLICATION NO. : 13/190720
DATED : November 3, 2015
INVENTOR(S) : Suemitsu It is certified that error appears in the above-identified patent and that said Letters Patent is hereby corrected as shown below:

In the claims

Column 6, Line 34, claim 5, "tom" should read tip.

Signed and Sealed this
Twelfth Day of April, 2016

Michelle K. Lee

Michelle K. Lee
*Director of the United States Patent and Trademark Office*